(12) United States Patent
Krivokapic

(10) Patent No.: US 6,291,832 B1
(45) Date of Patent: Sep. 18, 2001

(54) RESONANT TUNNELING DIODE LATCH

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/557,679

(22) Filed: Apr. 25, 2000

(51) Int. Cl.⁷ .......................... H01L 21/06; H01L 31/072
(52) U.S. Cl. ............................... 257/25; 257/22; 257/28; 257/368
(58) Field of Search .................. 438/2, 263, 594, 438/979, 983; 257/2, 9, 21, 22, 23, 24, 25, 46, 105, 104, 106, 594

(56) References Cited

U.S. PATENT DOCUMENTS 5,606,177   2/1997   Wallace et al. .
5,629,546   5/1997   Wu et al. .
5,757,051 * 5/1998   Wu et al. ............................ 257/368

* cited by examiner

Primary Examiner—David Nelms
Assistant Examiner—Dung A Le
(74) Attorney, Agent, or Firm—Sawyer Law Group LLP

(57) ABSTRACT

A method/system for forming a resonant tunneling diode latch is disclosed. The method/system comprises the steps of forming a gate on a silicon substrate, the silicon substrate having at least one SOI layer disposed therein, providing an oxide spacer over the gate, providing a first ion implant in a first region of the silicon substrate, and then providing an oxide layer. The method further comprises polishing the oxide back to the gate, removing the gate, providing a second ion implant in a second region of the silicon substrate wherein the first and second regions have an undoped portion of silicon there between. According to the present invention, the method/system for forming a resonant tunneling diode latch in an SOI substrate that is easily implemented and results in an increased throughput of resonant tunneling diode devices.

9 Claims, 5 Drawing Sheets

RESONANT TUNNELING DIODE LATCH

FIELD OF THE INVENTION

The present invention relates to electronic devices and more specifically to a method and system of fabricating a resonant tunneling diode latch.

BACKGROUND OF THE INVENTION

Existing complementary metal oxide silicon (CMOS) semiconductor devices that are produced in mass quantities are referred to as "bulk" CMOS, because they include a semiconductive bulk substrate on which active or passive circuit elements are disposed. Recently, silicon oxide insulator (SOI) devices have been introduced which consume less power than do bulk CMOS devices, an important advantage in many applications such as battery-powered mobile telephones and battery-powered laptop computers. Also, SOI devices advantageously operate at higher speeds than do bulk CMOS devices.

SOI devices are characterized by a thin layer of insulative material (the so-called buried oxide layer, or "SOI") that is sandwiched between a bulk substrate and the circuit elements of the device. Typically, no other layers of material are interposed between the SOI and the bulk substrate.

FIG. 1 is a sectional view of an SOI substrate 10. As shown in FIG. 1, by forming an SOI layer 12 and a buried oxide layer 14 on a semiconductor substrate, an SOI substrate is formed.

Additionally, resonant tunneling diodes (RTDs) also have a wide variety of high speed applications for CMOS devices. RTDs are two terminal devices with conduction carriers through potential barriers to yield current-voltage curves with portions exhibiting negative differential resistance. Because tunneling occurs through a potential barrier having a very narrow width, the frequency response of a resonant tunneling device is not limited by the diffusion or transit time of charge carriers. Instead, the frequency response is limited by the circuit capacitance and impedance of the device. The circuit capacitance and device impedance both scale directly with the area of the circuits and devices on the integrated circuit substrate, permitting devices to be downsized to about the width of the potential barrier.

RTDs, however, have not been particularly useful for integrated circuit applications, primarily because the RTD is a two-terminal device, and the current-voltage characteristic of the RTD is dictated rather rigidly by the properties of the semiconductor material used in constructing the RTD.

More recently it has become known to use molecular beam epitaxy to grow atomically thin layers of single crystal material on a semiconductor substrate to construct tunnel barriers permitting one to engineer a device having a desired current-voltage characteristic. In particular, one may easily select the width of the barrier to adjust the tunneling current, and one may construct an array of barriers in series to increase the "peak" and "valley" voltages of the current-voltage characteristic. This ability to engineer the physical structure of the tunneling barriers provides a high degree of design flexibility quite independent of the properties of the semiconductor material used for fabricating the RTD.

FIG. 2 is a flow chart illustrating the conventional process steps required to fabricate a resonant tunneling diode. First, a heavily doped n+ silicon layer is provided, via step 20. Next, a thin layer of undoped silicon is deposited over the n+ silicon layer, via step 22. This serves as the tunneling barrier and is typically grown using molecular beam epitaxy. A heavily doped p+ silicon layer is then provided via step 24. Finally, metal contacts are formed on each of the n+ and p+ silicon layers, via step 26.

For a further illustration of the conventional technology, please refer to FIG. 3. FIG. 3 shows a conventional RTD 30. The conventional RTD 30 comprises a heavily doped p+ silicon layer 32, a thin layer of undoped silicon 34, a heavily doped n+ silicon layer 36 and metal contacts 38. Accordingly, the thin layer of undoped silicon 34 serves as a tunneling barrier between the doped silicon layers 32, 36.

Although the conventional molecular beam epitaxy methodology adequately forms RTDs in silicon, the slow rate at which it operates ultimately prohibits its use in the manufacturing of electronic devices.

Accordingly, what is needed is a method and system for forming a resonant tunneling diode in an SOI structure that will result in an increased throughput and that is easy to implement. The present invention addresses such a need.

SUMMARY OF THE INVENTION

A method/system for forming a resonant tunneling diode latch is disclosed. The method/system comprises the steps of forming a gate on a silicon substrate, the silicon substrate having at least one SOI layer disposed therein, providing an oxide spacer over the gate, providing a first ion implant in a first region of the silicon substrate, and then providing an oxide layer. The method further comprises polishing the oxide layer back to the gate, removing the gate, and providing a second ion implant in a second region of the silicon substrate wherein the first and second regions have an undoped portion of silicon there between.

According to the present invention, the method/system for forming a resonant tunneling diode latch in an SOI substrate that is easily implemented and results in an increased throughput of resonant tunneling diode devices.

DETAILED DESCRIPTION

The present invention relates to a method and system for forming a resonant tunneling diode latch. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The method and system in accordance with the present invention is described in the context of a preferred embodiment. The preferred embodiment provides a method and system for forming a resonant tunneling diode latch. A latch, for the purposes of this patent application, comprises two diodes in series. Accordingly, the method and system in accordance with the present invention allows for the creation of two resonant tunneling diodes in series without using molecular beam epitaxy. Furthermore, the resonant tunneling diodes are formed in an SOI substrate. As a result, through the use of the method and system in accordance with the present invention RTD devices are formed in SOI substrates at a rate faster than that of the conventional molecular beam epitaxy methodology.

Figure 1:
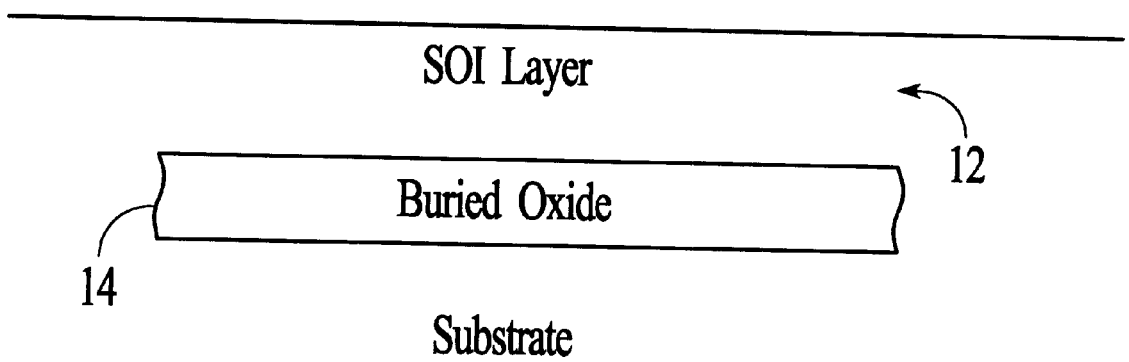
FIG. 1 is a sectional view of a conventional SOI substrate.
Figure 2:
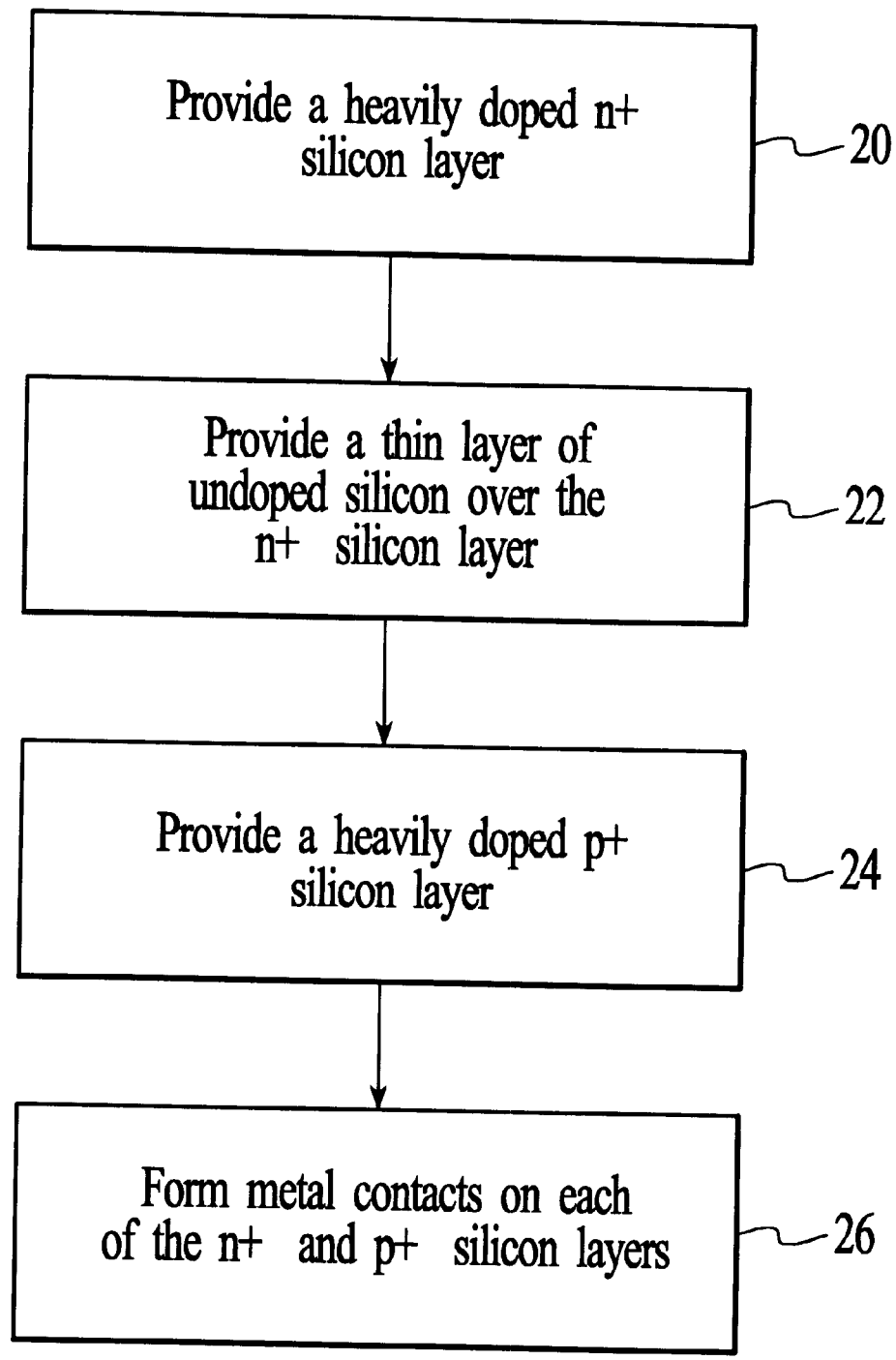
FIG. 2 is a flow chart illustrating the conventional process steps required to fabricate a resonant tunneling diode.
Figure 3:
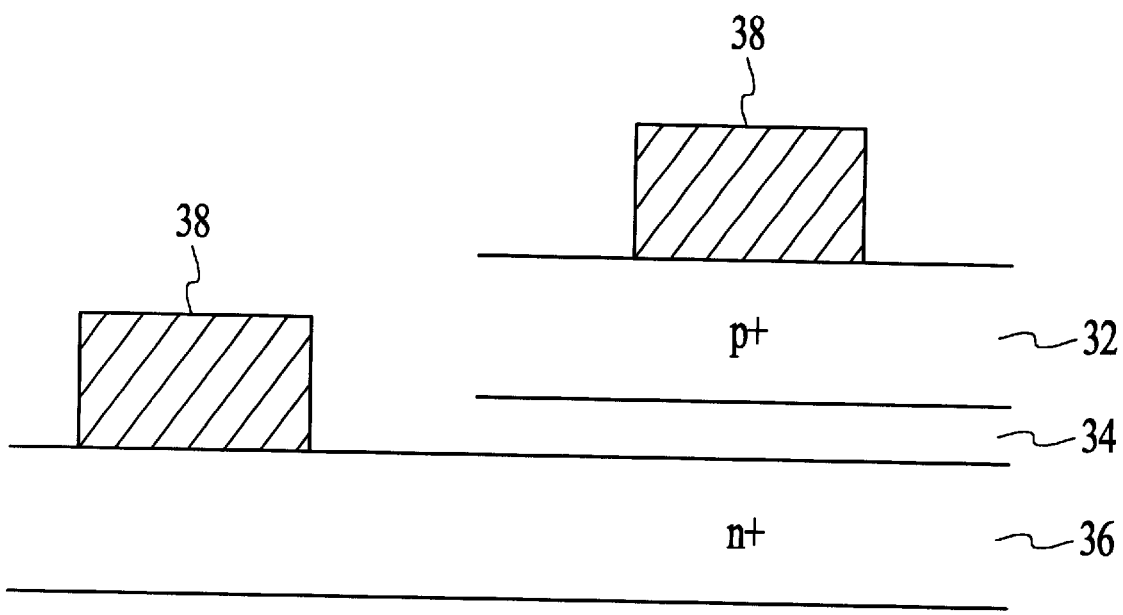
FIG. 3 shows a conventional resonant tunneling diode.
Figure 4:
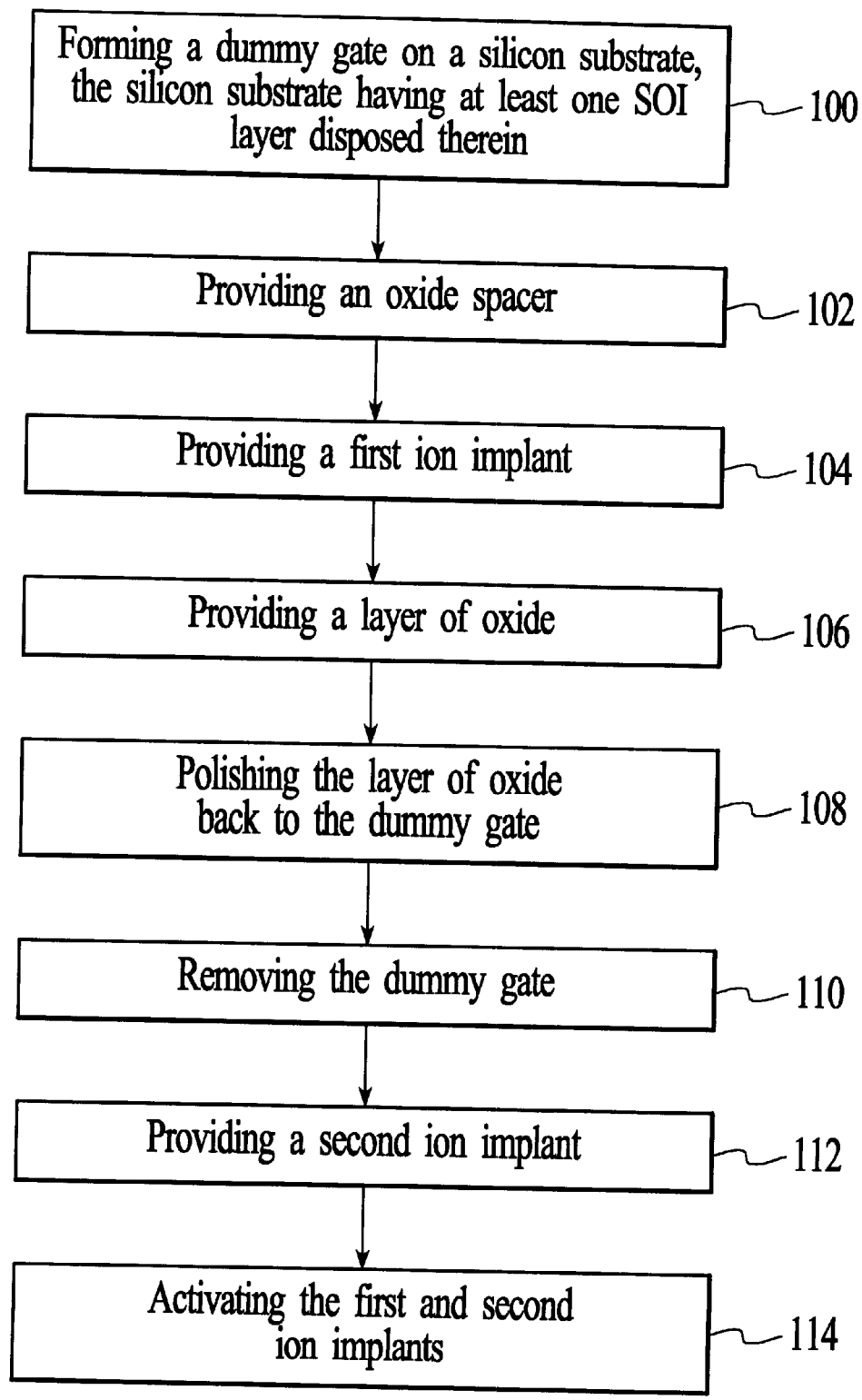
FIG. 4 is a flow chart illustrating the processing steps for forming a resonant tunneling diode latch according to a preferred embodiment.

FIG. 4 is a flow chart illustrating the processing steps for forming a resonant tunneling diode latch according to a preferred embodiment. The process begins by first forming a dummy gate on a silicone substrate, the silicon substrate having at least one SOI layer disposed therein, via step 100. Preferably, the dummy gate comprises $Si_3N_4$ nitride and a buffer oxide is utilized to avoid damaging the silicon substrate when forming the dummy gate. Also, the dummy gate should be wide enough to enable the subsequent placement of a metal contact. Next, an oxide spacer is provided, via step 102. This is a crucial step in the process because simulated results reveal that the width of the tunneling barrier is a function of the spacer width according to the following relationship:

$$T_{tb} = -30 \text{ Angstroms} + 0.45 \, (T_s)$$

Here, $T_{tb}$ is the thickness of the tunneling barrier and $T_s$ is the thickness of the oxide spacer. Preferably an oxide spacer with a thickness between 75 and 250 Angstoms is utilized which will provide a tunneling barrier with a thickness between 3.75 and 82.5 Angstroms.

Referring back to FIG. 4, a first ion implant is then provided, via step 104. This ion implant is performed on a first region of the silicon substrate and preferably comprises boron or another suitable p+ dopant. The implant dose of the p+ implant depends on the p+ dopant that is being used and is between $2e^5$ cm$^{-2}$ and $3e^{15}$ cm$^{-2}$ while the range of implant energy is between 1.5 keV and 15 keV. For example, Boron should have an implant dose between $2e^{15}$ cm$^{-2}$ and $3e^{15}$ cm$^{-2}$ with an implant energy between 1.5 keV and 3 keV while $BF_2$ should have an implant dose between $2e^{15}$ cm$^{-2}$ and $3e^{15}$ cm$^{-2}$ with an implant energy between 5 keV and 15 keV. Additionally, the dummy gate serves as a masking agent thereby preventing the masked area from being doped by the first ion implant. Next, a layer of oxide is provided, via step 106. Preferably this layer of oxide has a thickness greater than the thickness of the dummy gate. The layer of oxide is then polished back to the dummy gate, via step 108. The dummy gate is then removed, via step 110. This is preferably done by dipping the silicon substrate in hot phosphoric acid. Next, a second ion implantation is provided, via step 112.

This ion implant is performed on a second region of the silicon substrate and preferably comprises arsenic, antimony, or another suitable n+ dopant. The implant dose of the n+ implant depends on the n+ dopant that is being used and is between $2e^{15}$ cm$^{-2}$ and $4e^{16}$ cm$^{-2}$ while the range of implant energy is between 12.5 keV and 50 keV. For example, arsenic should have an implant dose between $2e^{15}$ cm$^{-2}$ and $4e^{15}$ cm$^{-2}$ with an implant energy between 12.5 keV and 25 keV while antimony should have an implant dose between $2e^{15}$ cm$^{-2}$ and $4e^{15}$ cm$^{-2}$ with an implant energy between 25 keV and 50 keV.

Figure 5:
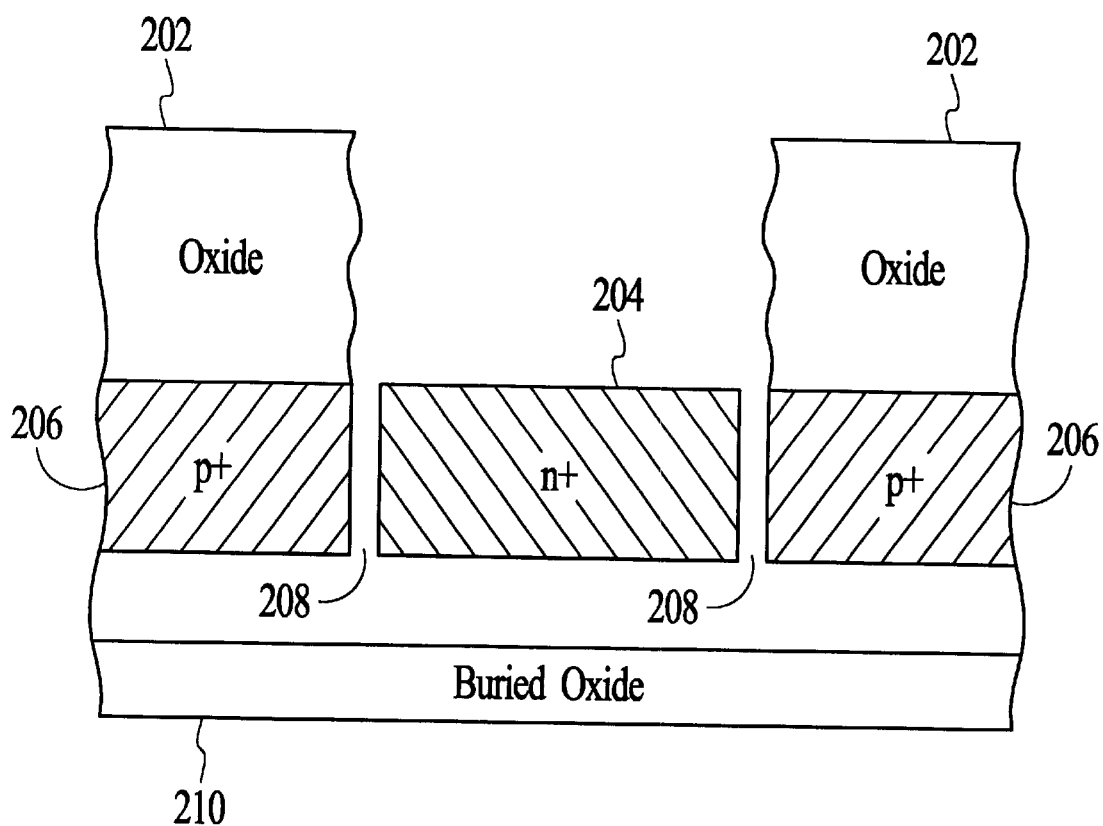
FIG. 5 shows the structure of a resonant tunneling diode latch in accordance with the present invention.

For a further illustration of the present invention, please refer to FIG. 5. FIG. 5 shows the structure 200 of a resonant tunneling diode latch after step 112 of the method in accordance with the present invention. The structure 200 comprises n+ doped region 204 and p+ doped regions 206. The doped regions 204 and 206 are disposed between the oxide layer 202 and a buried oxide layer 210. As a result of the placement of the oxide spacer in step 102, thin portions of undoped silicon 208 lay between the n+ doped region 204 and the p+ doped regions 206 and serve as tunneling barriers between n+ doped region 204 and the p+ doped regions 206.

Referring back to FIG. 4, finally, the first and second implants are activated, via step 114. This activation step preferably comprises laser annealing the doped silicon regions.

Laser thermal annealing prevents the diffusion of dopants into the undoped silicon barriers. Utilizing a laser thermal annealing process, a selected area of a silicon substrate is immersed in a gas and high-power projected laser radiation is used to heat the immersed gas and the particular regions of the substrate surface that are then being illuminated by the radiation. However, in order to utilize the laser annealing process, the surface layer of the silicon must be properly amorphized prior to doping the selected silicon.

Amorphization may be achieved by the ion implantation of a heavy atom, such as argon, silicon or germanium to a desired amorphous depth in the silicon substrate. Depending on the desired amorphization depth, the range of the implant dose is between $1 \times 10^{13}$ cm$^{-2}$ and $1 \times 10^{16}$ cm$^{-2}$ while the range of implant energy is between 5 keV and 400 keV. Preferably, the amorphization is done right before steps 104 and 112. This essentially creates a layer of amorphized silicon. This layer of amorphized silicon consequently has a lower melting temperature then the underlying crystalline silicon. After introducing dopant to the silicon substrate, the laser anneal is then provided at a temperature that is sufficient to melt the amorphized silicon but is insufficient to melt the crystalline silicon.

A method/system for fabricating a resonant tunneling diode latch has been disclosed. Although the present invention has been described in accordance with the embodiments shown, one of ordinary skill in the art will readily recognize that there could be variations to the embodiments and those variations would be within the spirit and scope of the present invention. For example, although the preferred embodiment of the method/system in accordance with the present invention contemplates the utilization of a laser annealing process, one of ordinary skill in the art will readily recognize that a variety of annealing processes could used while remaining within the spirit and scope of the present invention. Accordingly, many modifications may be made by one of ordinary skill in the art without departing from the spirit and scope of the appended claims.

What is claimed is:

1. A resonant tunneling diode latch comprising:
    a silicon substrate having at least one silicon oxide insulator (SOI) layer disposed therein;
    a first doped region in the silicon substrate;
    an oxide layer over the first doped region; and
    a second doped region in the silicon substrate disposed laterally adjacent to the first doped region,
    wherein the first and second doped regions are disposed between the oxide layer and the at least one SOI layer, and the first and second doped regions are vertically separated by a tunneling barrier, the tunneling barrier being an undoped portion of the silicon substrate.

2. The device of claim 1 wherein the first doped region comprises a p+ dopant.

3. The device of claim 1 wherein the p+ dopant has an implant dose between $2e^{15}$ cm$^{-2}$ and $3e^{15}$ cm$^{-2}$ with a range of implant energy between 1.5 keV and 15 keV.

4. The device of claim 2 wherein the second doped region comprises a n+ dopant.

5. The device of claim 4 wherein the n+ dopant has an implant dose between $2e^{15}$ cm$^{-2}$ and $4e^{16}$ cm$^{-2}$ with a range of implant energy between 12.5 keV and 50 keV.

6. The device of claim 1 wherein the first and second doped regions are activated.

7. The device of claim 6 wherein the first doped region is formed by amorphizing a first region of the silicon substrate and implanting the p+ dopant into the first region.

8. The device of claim 7 wherein the second doped region is formed by amorphizing a second region of the silicon substrate and implanting the n+ dopant into the second region.

9. The device of claim 8 wherein activating the first and second doped regions comprises laser annealing the first and second doped regions.

* * * * *